US009318327B2

(12) United States Patent
Bergmann et al.

(10) Patent No.: US 9,318,327 B2
(45) Date of Patent: Apr. 19, 2016

(54) SEMICONDUCTOR DEVICES HAVING LOW THREADING DISLOCATIONS AND IMPROVED LIGHT EXTRACTION AND METHODS OF MAKING THE SAME

(75) Inventors: Michael John Bergmann, Chapel Hill, NC (US); Jason Hansen, Holly Springs, NC (US); David Todd Emerson, Chapel Hill, NC (US); Kevin Ward Haberern, Cary, NC (US)

(73) Assignee: CREE, INC., Durham, NC (US)

( * ) Notice: Subject to any disclaimer, the term of this patent is extended or adjusted under 35 U.S.C. 154(b) by 778 days.

(21) Appl. No.: 11/563,712

(22) Filed: Nov. 28, 2006

(65) Prior Publication Data

US 2008/0121910 A1    May 29, 2008

(51) Int. Cl.
H01L 29/06     (2006.01)
H01L 21/02     (2006.01)
H01L 31/0236   (2006.01)
H01L 33/00     (2010.01)

(52) U.S. Cl.
CPC ...... *H01L 21/02658* (2013.01); *H01L 21/0242* (2013.01); *H01L 21/0254* (2013.01); *H01L 21/02378* (2013.01); *H01L 21/02392* (2013.01); *H01L 21/02395* (2013.01); *H01L 21/02403* (2013.01); *H01L 21/02425* (2013.01); *H01L 31/0236* (2013.01); *H01L 33/007* (2013.01); *Y02E 10/50* (2013.01)

(58) Field of Classification Search
USPC ............. 257/95, 79, 81, 98–100, 42, 44, 466, 257/622; 438/22, 42, 44
IPC ............................................. H01L 29/30,33/22
See application file for complete search history.

(56) References Cited

U.S. PATENT DOCUMENTS

| 3,739,217 A | 6/1973 | Bergh et al. |
| 3,988,497 A | 10/1976 | Asakura |
| 4,013,915 A | 3/1977 | Dufft |
| 4,233,613 A | 11/1980 | Morimoto |

(Continued)

FOREIGN PATENT DOCUMENTS

| JP | H10506234 | 6/1998 |
| JP | 2000-106455 A | 4/2000 |

(Continued)

OTHER PUBLICATIONS

German Office Action in counterpart German Application No. 10 2007 056 970.1, dated Oct. 29, 2009.

(Continued)

*Primary Examiner* — Eugene Lee
(74) *Attorney, Agent, or Firm* — Koppel, Patrick, Heybl & Philpott (57) ABSTRACT

Semiconductor device structures are provided that are suitable for use in the fabrication of electronic devices such as light emitting diodes. The semiconductor device structures include a substrate having a roughened growth surface suitable for supporting the growth of an epitaxial region thereon. The device structure can include an epitaxial region having reduced defects and/or improved radiation extraction efficiency on the roughened growth surface of the substrate. The roughened growth surface of the substrate can have an average roughness $R_a$ of at least about 1 nanometer (nm) and an average peak to valley height $R_z$ of at least about 10 nanometers (nm).

65 Claims, 5 Drawing Sheets

(56) References Cited

U.S. PATENT DOCUMENTS

| | | | |
|---|---|---|---|
| 4,946,547 A | 8/1990 | Palmour et al. | |
| 5,087,949 A | 2/1992 | Haitz | |
| 5,132,751 A | 7/1992 | Shibata et al. | |
| 5,200,022 A | 4/1993 | Kong et al. | |
| 5,210,051 A | 5/1993 | Carter et al. | |
| 5,292,501 A | 3/1994 | Degenhardt et al. | |
| RE34,861 E | 2/1995 | Davis et al. | |
| 5,393,993 A | 2/1995 | Edmond et al. | |
| 5,523,589 A | 6/1996 | Edmond et al. | |
| 5,779,924 A | 7/1998 | Krames et al. | |
| 5,793,062 A | 8/1998 | Kish, Jr. et al. | |
| 6,015,719 A | 1/2000 | Kish, Jr. et al. | |
| 6,120,600 A | 9/2000 | Edmond et al. | |
| 6,187,606 B1 | 2/2001 | Edmond et al. | |
| 6,218,680 B1 | 4/2001 | Carter et al. | |
| 6,265,236 B1 | 7/2001 | Gerner | |
| 6,277,665 B1 | 8/2001 | Ma et al. | |
| 6,335,546 B1 | 1/2002 | Tsuda et al. | |
| 6,410,348 B1 | 6/2002 | Chen et al. | |
| 6,410,942 B1 | 6/2002 | Thibeault et al. | |
| 6,429,462 B1 | 8/2002 | Shveykin | |
| 6,452,216 B1* | 9/2002 | Tsuda et al. | 257/94 |
| 6,469,324 B1 | 10/2002 | Wang | |
| 6,495,862 B1 | 12/2002 | Okazaki et al. | |
| 6,504,180 B1 | 1/2003 | Heremans et al. | |
| 6,578,601 B2 | 6/2003 | Giordano | |
| 6,608,326 B1* | 8/2003 | Shinagawa et al. | 257/64 |
| 6,635,503 B2 | 10/2003 | Andrews et al. | |
| 6,649,938 B1 | 11/2003 | Bogatov et al. | |
| 6,649,939 B1 | 11/2003 | Wirth | |
| 6,657,236 B1 | 12/2003 | Thibeault et al. | |
| 6,661,028 B2 | 12/2003 | Chen et al. | |
| 6,664,560 B2 | 12/2003 | Emerson et al. | |
| 6,711,191 B1 | 3/2004 | Kozaki et al. | |
| 6,730,939 B2 | 5/2004 | Eisert et al. | |
| 6,734,033 B2 | 5/2004 | Emerson et al. | |
| 6,740,906 B2 | 5/2004 | Slater, Jr. et al. | |
| 6,748,002 B2 | 6/2004 | Shveykin | |
| 6,784,463 B2 | 8/2004 | Camras et al. | |
| 6,791,119 B2 | 9/2004 | Slater, Jr. et al. | |
| 6,794,687 B1 | 9/2004 | Kurahashi et al. | |
| 6,812,161 B2 | 11/2004 | Heremans et al. | |
| 6,821,804 B2 | 11/2004 | Thieault et al. | |
| 6,825,056 B2* | 11/2004 | Asakawa et al. | 438/47 |
| 6,831,302 B2 | 12/2004 | Erchak et al. | |
| 6,844,571 B2 | 1/2005 | Krames et al. | |
| 6,885,034 B1 | 4/2005 | Schoenfeld | |
| 6,900,473 B2 | 5/2005 | Yoshitake et al. | |
| 6,900,476 B2 | 5/2005 | Steubel et al. | |
| 6,989,555 B2 | 1/2006 | Goetz et al. | |
| 7,018,859 B2* | 3/2006 | Liao et al. | 438/22 |
| 7,037,738 B2 | 5/2006 | Sugiyama et al. | |
| 7,052,979 B2* | 5/2006 | Nagai et al. | 438/478 |
| 7,470,938 B2* | 12/2008 | Lee et al. | 257/103 |
| 7,534,633 B2 | 5/2009 | Batres et al. | |
| 2004/0124469 A1* | 7/2004 | Makita | 257/347 |
| 2004/0135180 A1* | 7/2004 | Makita | 257/285 |
| 2004/0149993 A1 | 8/2004 | McClure et al. | |
| 2005/0082562 A1 | 4/2005 | Ou et al. | |
| 2005/0127832 A1* | 6/2005 | Toguchi et al. | 313/512 |
| 2005/0141577 A1* | 6/2005 | Ueta et al. | 372/43 |
| 2005/0227379 A1* | 10/2005 | Donofrio | 438/4 |
| 2005/0230699 A1* | 10/2005 | Wu et al. | 257/98 |
| 2006/0001046 A1 | 1/2006 | Batres et al. | |
| 2006/0038190 A1* | 2/2006 | Park et al. | 257/95 |
| 2006/0060888 A1* | 3/2006 | Kim et al. | 257/200 |
| 2006/0094244 A1* | 5/2006 | Yamada et al. | 438/700 |
| 2006/0163595 A1* | 7/2006 | Hsieh et al. | 257/95 |
| 2006/0189017 A1* | 8/2006 | Nogami | 438/46 |
| 2006/0202219 A1* | 9/2006 | Ohashi et al. | 257/98 |
| 2007/0058059 A1* | 3/2007 | Suehiro | 348/294 |

FOREIGN PATENT DOCUMENTS

| | | |
|---|---|---|
| JP | 2000196152 | 7/2000 |
| JP | 2002093726 | 3/2002 |
| JP | 2002164296 | 6/2002 |
| JP | 2002335014 | 11/2002 |
| JP | 2003151908 | 5/2003 |
| JP | 2003218383 | 7/2003 |
| JP | 2004311986 | 11/2004 |
| JP | 2005045054 | 2/2005 |
| JP | 2002045054 | 5/2005 |
| JP | 2005191530 | 7/2005 |
| JP | 2005244202 | 9/2005 |
| JP | 2005327821 | 11/2005 |
| JP | 2006-210916 A | 8/2006 |
| JP | 2006253298 | 9/2006 |
| JP | 2006-275844 | 10/2006 |
| JP | 2008505507 | 2/2008 |
| JP | 2008-112957 A | 5/2008 |
| WO | WO 01/41225 A2 | 6/2001 |

OTHER PUBLICATIONS

English translation of German Office Action in counterpart German Application No. 10 2007 056 970.1, dated Oct. 29, 2009.
Notice of Reasons for Rejection from corresponding Japanese Patent Application No. 2007-307066, dated Jul. 17, 2012.
Office Action from corresponding German Patent Application No. 10 2007 056 970.1, Mar. 14, 2012.
Notice of Reasons for Rejection for counterpart Japanese Patent Application No. 2007-307066 mailed Apr. 27, 2011.
Decision of Rejection from Japanese Patent Appl. No. 2007-307066, dated Jun. 25, 2013.
Office Action from Korean Patent Appl. No. 10-2008-7004187, dated Oct. 25, 2013.
Interrogation from Japanese Patent appl. No. 2007-307066, dated Jan. 21, 2014.
Rejection Decision from Taiwanese patent appl. No. 095125858, dated Jan. 27, 2014.
Notice of Final Rejection from Korean Patent Appl. No. 10-2008-7004187, dated Apr. 24, 2014.
Appeal Decision from Japanese Patent Appl. No. 2008-522793, dated Jun. 26, 2014.
Appeal Decision from Japanese Appl. No. 2013-20696, dated Sep. 2, 2014.
Notice of Results of Re-Consideration Prior to Appellate Procedure from Korean Appl No. 10-2008-7004187, dated Aug. 27, 2014.
Notice of Allowance from Taiwanese Patent Appl. No. 095125858, dated Jan. 23, 2015.
Decision Affirming the Final Rejection from Korean Appl. No. 2008-7004187, dated May 17, 2015.
Office Action for counterpart Japanese Patent Application No. 2007-307066 mailed May 18, 2010.
Patent Abstracts of Japan Publication No. 2000-106455A, dated Apr. 11, 2000, Sharp Corp.
Patent Abstracts of Japan Publication No. 2008-112957A, dated May 11, 2008 Mitsubishi Cable Ind. Ltd.
Patent Abstracts of Japan Publication No. 2006-275844, dated Oct. 12, 2006, National Institute for Agro-Environmental Science.

* cited by examiner

SEMICONDUCTOR DEVICES HAVING LOW THREADING DISLOCATIONS AND IMPROVED LIGHT EXTRACTION AND METHODS OF MAKING THE SAME

BACKGROUND OF THE INVENTION

The present invention relates to semiconductor devices and, more particularly, to semiconductor devices useful in the fabrication of light emitting diodes (LEDs).

Light emitting diodes (LEDs) are an important class of solid-state devices that convert electric energy to light. LEDs generally include an active layer of semiconductor material sandwiched between two oppositely doped layers. When a bias is applied across the doped layers, holes and electrons are injected into the active layer where they recombine to generate light. Light is emitted omnidirectionally from the active layer and from all surfaces of the LED. Recent advances in LEDs (such as nitride based LEDs) have resulted in highly efficient light sources that surpass the efficiency of filament-based light sources, providing light with equal or greater brightness in relation to input power.

Successful materials for producing LEDs (including light emitting diodes, laser diodes, photodetectors and the like) capable of operation in the UV, blue and green portions of the electromagnetic spectrum include the Group III nitride compound semiconductor materials, and in particular gallium nitride-based compound semiconductors. However, gallium nitride (GaN) presents a particular set of technical problems in manufacturing working devices. The primary problem is the lack of bulk single crystals of gallium nitride which in turn means that gallium nitride or other Group III nitride devices must be formed as epitaxial layers on other materials.

Sapphire (i.e., aluminum oxide or $Al_2O_3$) has been commonly used as a substrate for Group III nitride devices. Sapphire offers a reasonable crystal lattice match to Group III nitrides, thermal stability, and transparency, all of which are generally useful in producing a light emitting diode. Sapphire offers the disadvantage, however, of being an electrical insulator. This means that the electric current that is passed through an LED to generate the emission cannot be directed through the sapphire substrate. Thus, other types of connections to the LED must be made, such as placing both the cathode and anode of the device on the same side of the LED chip in a so-called "horizontal" configuration.

In contrast to sapphire, silicon carbide (SiC) can be conductively doped, and therefore can be effectively used to manufacture a "vertical" Group III nitride LED, in which ohmic contacts can be placed at opposite ends of the device. In addition, silicon carbide has a relatively small lattice mismatch with GaN, which means that high-quality Group III nitride material can be grown on it. Silicon carbide also has a high coefficient of thermal conductivity, which can be important for heat dissipation in high-current devices such as laser diodes.

Despite the advantages of these and other LED devices, the fabrication of LEDs using heteroepitaxial growth on substrates such as silicon carbide or sapphire can be problematic. Some crystal mismatch can occur when a GaN epitaxial layer is grown on a different substrate, such as a SiC substrate, and the resulting epitaxial layer can be strained by this mismatch. Such mismatches, and the strain they produce, can carry with them the potential for crystal defects, which in turn can affect the electronic characteristics of the crystals and the junctions and thus correspondingly can degrade or even prevent the performance of the device.

For example, threading dislocations, which are linearly extending defects that penetrate the crystal layer along the growth direction, can be introduced into the epitaxial layer during the process of lattice relaxation. If the deposited layer has many penetrating defects, the light emitting performance of the device can deteriorate substantially. Threading dislocations can act as a non-radiative recombination center for carriers, and accordingly the presence of such non-radiative centers can reduce device brightness and efficiency.

In addition, conventional silicon carbide substrates can absorb some light in portions of the visible spectrum. For silicon carbide devices that are vertical devices that are mounted with the substrates facing down, some light entering the substrate can be reflected back through the substrate before it is extracted from the device, thereby increasing absorption losses in the substrate. Reflection losses also may reduce the overall efficiency of the device.

BRIEF SUMMARY OF THE INVENTION

The present invention can provide semiconductor device structures that can be suitable for use in the fabrication of electronic devices, such as LEDs. The semiconductor device structures can have a variety of desirable properties, including reduced crystal defects and enhanced light extraction. Accordingly, the structures can be useful in the fabrication of LEDs exhibiting improved efficiencies.

In various exemplary embodiments of the invention, the semiconductor device structures can include a substrate, such as a conductive SiC or insulating sapphire substrate, having a roughened growth surface that is suitable for supporting the growth of an epitaxial region thereon. The roughened growth surface of the substrate can have an average roughness $R_a$ of at least about 1 nanometer (nm) and further can have an average peak to valley height $R^z$ of at least about 10 nanometers (nm). The semiconductor device structures can further include an epitaxial region on the roughened growth surface of the substrate. The resultant epitaxial layer can have reduced defects, such as reduced threading dislocations, and/or improved radiation extraction efficiency. Various exemplary embodiments of the invention can include semiconductor device structures including an epitaxial region having a threading dislocation of less than or about $6 \times 10^8$ $cm^{-2}$ on the roughened growth surface of the substrate, and in certain embodiments a threading dislocation of less than or about $10^8$ $cm^{-2}$.

In various embodiments of the invention, the epitaxial region can include a diode region, which can include an active region capable of emitting radiation, an n-type layer along a first surface of the active region, and a p-type layer on a second opposing surface of the active region. Each of the active region, the n-type layer and the p-type layer can include a Group III nitride layer. The epitaxial region of the invention can further include a buffer layer. Exemplary devices of the invention include vertical LEDs in which the substrate is a conductive substrate, and which further include a first ohmic layer on a surface of the conductive substrate opposite the diode region and a second ohmic contact on a surface of the diode region opposite the conductive substrate.

The present invention further includes methods for fabricating a semiconductor device structure suitable for use in the fabrication of electronic devices such as LEDs. The method of the invention includes the step of treating a substrate growth surface suitable for supporting the growth of an epitaxial region thereon to roughen the growth surface. The substrate growth surface can be treated using various processes, such as mechanical removal of material, etching, and photonic interaction (i.e., laser ablation). The method of the invention further includes the step of forming an epitaxial region on the roughened growth surface, wherein the epitaxial region can exhibit reduced defects and/or improved radiation extraction efficiency.

BRIEF DESCRIPTION OF THE DRAWINGS

Having thus described the invention in general terms, reference will now be made to the accompanying drawings, which are not necessarily drawn to scale, and in which:

DETAILED DESCRIPTION OF THE INVENTION

The present invention now will be described more fully hereinafter with reference to the accompanying drawings, in which some, but not all embodiments of the invention are shown. Indeed, this invention may be embodied in many different forms and should not be construed as limited to the embodiments set forth herein; rather, these embodiments are provided so that this disclosure will satisfy applicable legal requirements. Like numbers refer to like elements throughout the specification.

The terminology used herein is for the purpose of describing particular embodiments only and is not intended to be limiting of the invention. As used herein the term "and/or" includes any and all combinations of one or more of the associated listed items. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "above," "on" or extending "onto" another element, it can be directly above, directly on or extend directly onto the other element or intervening elements may also be present. In contrast, when an element is referred to as being "directly above," "directly on" or extending "directly onto" another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "above" or "upper" or "top" and "below" or "lower" or "bottom," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "upper" side of other elements and/or "above" other elements would then be oriented on "lower" sides of the other elements and/or "below" the other elements. The exemplary term "above" can therefore encompass both an orientation of "above" and "below," depending of the particular orientation of the figure. Similarly, if the device in one of the figures is turned over, elements described as "below" or "beneath" other elements would then be oriented "above" the other elements. The exemplary terms "below" or "beneath" can, therefore, also encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

FIGS. 1-4 schematically illustrate various semiconductor device structures including a substrate, an epitaxial region and optionally one or more additional layers and/or regions. The dimensions of the substrates, epitaxial layers and additional layers and/or regions of the devices of FIGS. 1-4 are not drawn to scale but are exaggerated for illustrative purposes.

Figure 1:
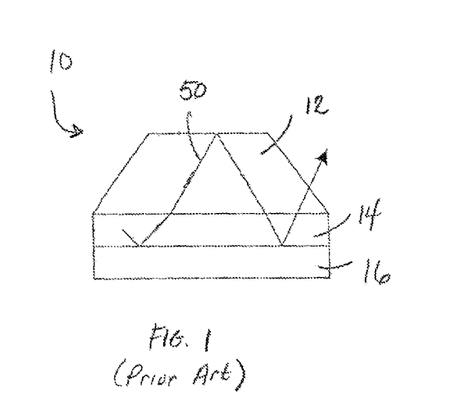
FIG. 1 is a schematic cross-sectional view of a semiconductor device structure as exemplified by the prior art.

FIG. 1 illustrates a simplified schematic of an exemplary prior art LED device structure 10 including a substrate 12, an epitaxial region 14 including a diode region, and a reflective layer 16. The opposing surfaces of the substrate 12 are substantially smooth or planar. If there is a lattice mismatch between the substrate 12 and the epitaxial region 14, the device can include an undesirably high concentration of crystal defects, such as threading dislocations, which can negatively impact the performance of the device.

In addition, a substrate such as SiC can have a relatively high index of refraction. Because of the high index of refraction of SiC, light passing through a SiC substrate tends to be totally internally reflected into the substrate at the surface of the substrate unless the light strikes the surface as a fairly low angle of incidence. For example, as illustrated in FIG. 1, a light ray 50 generated in an active region of the epitaxial region 14 may initially travel in a direction away from the substrate 12, but can be reflected back through the substrate 12 before it is extracted from the device 10. The inventors have found that the substantially planar or smooth growth surface of the substrate layer 12 can reduce light extraction from the device and increase absorption losses.

In contrast to prior art devices, in various embodiments, the semiconductor device structures of the present invention can exhibit reduced defect densities in an epitaxial region grown on the substrate growth surface as compared to the same epitaxial layer on a substantially smooth substrate growth surface. In non-limiting examples, exemplary devices of the invention can include an epitaxial region having a threading dislocation of less than or about $6 \times 10^8$ cm$^{-2}$ and in further embodiments of the invention an epitaxial region having a threading dislocation of less than or about $10^8$ cm$^{-2}$. The present invention is not limited to devices having these defect densities and includes devices with defect densities outside of these ranges as well. In addition, the devices of the invention can exhibit enhanced light extraction as compared to prior art devices. Exemplary devices of the present invention can include a substrate having a growth surface with a roughness sufficient to increase the radiation extraction efficiency of an active region on the roughened surface, as compared to the radiation extraction efficiency of the same active region on a substantially smooth growth surface. Exemplary devices can include a conductive substrate with a growth surface having has an average roughness $R_a$ of at least about 1 nanometer (nm) and an average peak to valley height $R_z$ of at least about 10 nanometers (nm). Still further, the present invention can include devices exhibiting enhanced light extraction, and/or reduced defects as discussed herein, and/or both.

Figure 2:
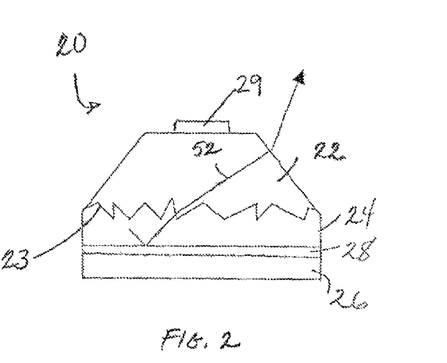
FIG. 2 is a schematic cross-sectional view of a semiconductor device structure in accordance with one embodiment of the present invention.

FIG. 2 schematically illustrates a cross-sectional view of an exemplary semiconductor device structure 20 in accordance with one embodiment of the present invention. The device 20 includes a substrate 22, which can optionally comprise a conductive substrate, having a growth surface 23 suitable for supporting the growth of an epitaxial region 24 thereon. As discussed in more detail below, the epitaxial region 24 can include a plurality of Group III nitride epitaxial layers, at least one or more of which can provide a diode region. The epitaxial region 24 can also optionally include a conductive buffer disposed between the substrate 22 and the diode region.

The substrate 22 can be formed of any the material suitable for use in a semiconductor device structure, including substrates useful for LEDs. The substrate can be electrically conductive. Exemplary substrates useful in the invention include single crystal silicon carbide (SiC) substrates. Silicon carbide can be an attractive substrate for LEDs because it can be made conductive, has a lattice match that can be appropriately buffered to a Group III nitride active layer, and can have excellent thermal and mechanical stability. The SiC substrate 22 can have a polytype selected from the 3C, 4H, 6H, and 15R polytypes of silicon carbide.

Because SiC can be made conductive, it can be particularly useful in the fabrication of LEDs in which ohmic contacts are placed at opposite ends of the device, referred to in the art as "vertical" devices. In contrast, an electric current that is passed through an LED to generate the emission cannot be directed through an electrically insulating substrate such as a sapphire substrate, thereby requiring that other types of connections to the LED must be made, such as placing both the cathode and anode of the device on the same side of the LED chip in a so-called "horizontal" configuration. Such horizontal devices can be more complex to manufacture as compared to vertical devices.

Examples of silicon carbide-based Group III nitride LEDs are shown in U.S. Pat. Nos. 5,523,589; 6,120,600; and 6,187,606, each of which is assigned to Cree, Inc., the assignee of the present invention, and the contents of each of which are incorporated herein by reference in their entirety. Such devices typically include a silicon carbide substrate, a buffer layer or region formed on the substrate, and a plurality of Group III nitride layers forming a p-n junction active region.

Silicon carbide substrates suitable for use in the present invention are commercially available and include, for example, silicon carbide substrates manufactured by Cree, Inc. of Durham, N.C., the assignee of the present invention. Methods of producing suitable silicon carbide substrates are known in the art and are described, for example, in U.S. Pat. Nos. Re 34,861; 4,946,547; 5,200,022; and 6,218,680, the contents of which are incorporated herein by reference in their entirety.

Although embodiments of the present invention are described herein with reference to a silicon carbide substrate, embodiments of the present invention may utilize any suitable substrate, including conductive, semi-conducting and/or insulating substrates, such as but not limited to sapphire, aluminum nitride, gallium nitride, silicon, GaAs, GaP, ZnO, and the like.

As illustrated in FIG. 2, the growth surface 23 of the substrate 22 is roughened. As used herein, the term "roughened" surface refers to at least a portion or region of a substrate surface, the topography of which has been altered so that the surface is not substantially smooth or planar. In various embodiments of the invention, the substrate surface is substantially randomly and/or irregularly roughened. Various techniques known in the art can be employed to roughen (or alter) a substrate surface topography, including without limitation, mechanical, etching and photonic processes, as discussed in more detail below.

Figure 3:
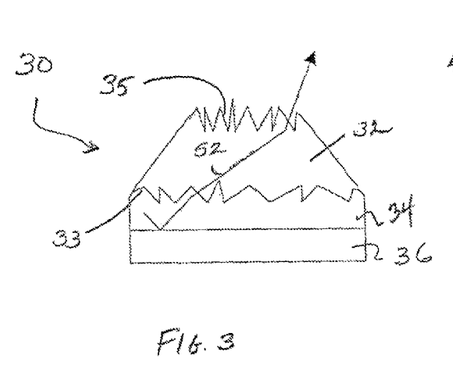
FIG. 3 is a schematic cross-sectional view of a semiconductor device structure in accordance with another embodiment of the present invention.
Figure 4:
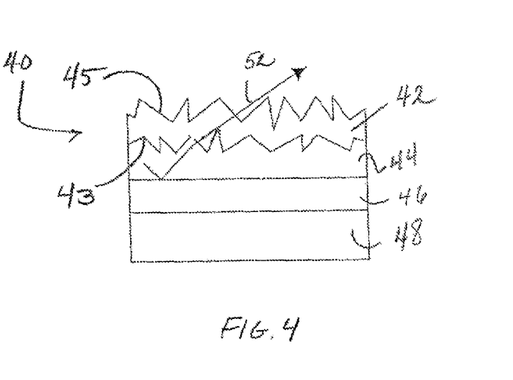
FIG. 4 is a schematic cross-sectional view of a semiconductor device structure in accordance with another embodiment of the present invention.
Figure 5A:
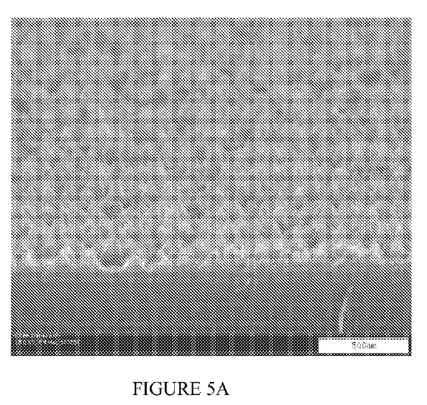
FIGS. 5A, 5B, 6A, 6B and 7 are scanning electron microscope (SEM) images of a roughened SiC substrate surface useful in a semiconductor device structure of an exemplary embodiment of the present invention.
Figure 5B:
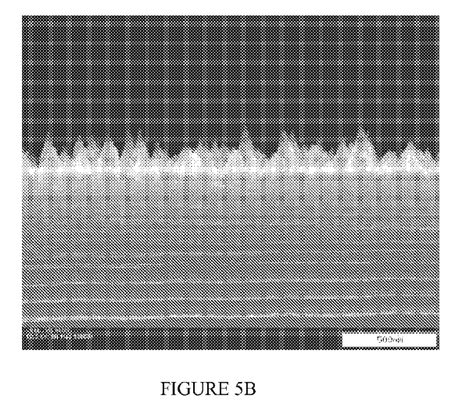
Figure 6A:
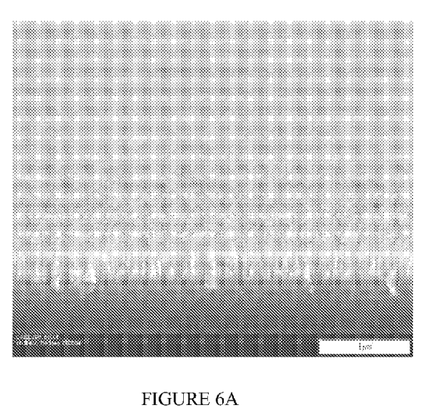
Figure 6B:
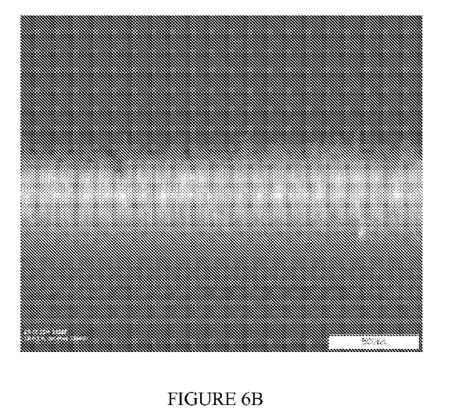
Figure 7:
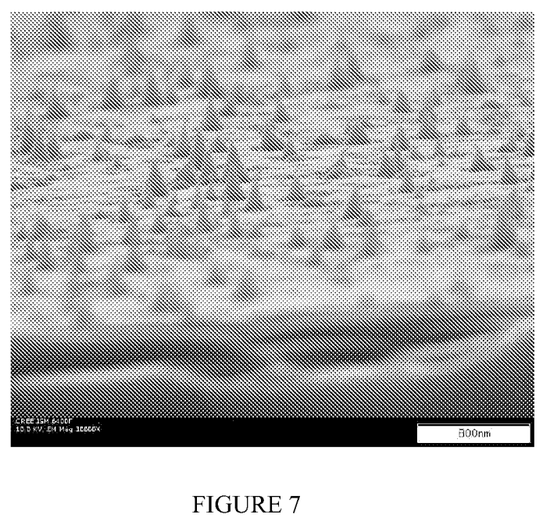

In other exemplary embodiments of the invention, a surface of the substrate opposite the growth surface can also be roughened. As non-limiting examples, FIG. 3 illustrates an exemplary device structure 30, which can include a substrate 32 with opposing roughened surfaces 33 and 35, and FIG. 4 illustrates another exemplary device structure 40, which can include a substrate 42 with opposing roughened surfaces 43 and 45.

Exemplary substrates in accordance with the present invention can have at least one surface, and in alternative embodiments at least two opposing surfaces, with average surface roughness $R_a$ of at least about 1 nanometer (nm). The term "$R_a$" is well known in the art and refers to the arithmetic mean of the absolute values of all peak-to-peak distances in a roughness profile R from a center line inside the total measuring section $I_m$. Stated differently, the average roughness is defined by the area between the roughness profile and its mean line, or the integral of the absolute value of the roughness profile height over the evaluation length, as represented by the following formula:

$$R_a = \frac{1}{L}\int_0^L |r(x)|dx$$

When evaluated from digital data, the integral can be approximated by a trapezoidal rule in accordance with the following formula:

$$R_a = \frac{1}{N}\sum_{n=1}^{N} |r_n|$$

Graphically, the average roughness is the area between the roughness profile and its center line divided by the evaluation length (which normally can be five sample lengths, with each sample length equal to one cutoff). Stated differently, the average roughness can be expressed as the total area of the peaks and valleys divided by the evaluation length. Any of the known techniques for evaluating $R_a$ of a surface can be employed in accordance with the present invention, including ASME B46.1-1995; ASME B46.1-1985; ISO 4287-1997; and/or ISO 4287/1-1997.

Exemplary substrates in accordance with the present invention can further have at least one surface, and in alternative embodiments at least two opposing surfaces, with a roughness as defined by its average peak to valley height $R_z$ of at least about 10 nanometers (nm). The term "$R_z$" is also well known in the art and refers to the sum of the height of the highest peak plus the lowest valley depth within a sampling length. Any of the known techniques for evaluating $R_z$ of a surface can be employed in accordance with the present invention, including ASME B46.1-1995 and ISO 4287-1997.

In the present invention, as illustrated in FIGS. 2, 3 and 4, the presence of a roughened substrate surface at the interface of the substrate and the epitaxial region can enhance light extraction from the device and thereby can improve the overall performance of the device. Although not wishing to be bound by any theory of explanation of the invention, it is currently believed that the roughened substrate growth surface can enhance scattering or lensing of the radiation, as demonstrated schematically by a light ray 52. The enhanced light scattering or lensing can result in light generated by the active region escaping from the substrate with a shorter optical path length, and thus with less absorptive loss, as compared to devices having substantially planar substrate growth surfaces. In contrast, as schematically illustrated in FIG. 1, the light ray 50 generated in the active region of a device having substantially planar substrate surfaces can have a longer optical path before the light escapes from the device.

Turning again to FIG. 2, the device 20 can be particularly useful in the production of LEDs. Accordingly, the epitaxial region 24 can include an active region capable of emitting radiation as is known in the art. The active region can include a p-n junction and can include a single heterostructure, double heterostructure, single quantum well, multiple quantum well, or the like, as known in the art.

The epitaxial region 24 can be formed of any of the materials known in the art that are suitable for the production of a semiconductor device, including LEDs. Exemplary epitaxial layers useful in the fabrication of the epitaxial region 24 of the devices of the invention can include without limitation Group III nitride epitaxial layers. As used herein, the term "Group III nitride" refers to those semiconductor compounds formed between nitrogen and the elements of Group III of the Periodic Table, usually aluminum (Al), gallium (Ga) and/or indium (In). The term also refers to ternary and quaternary compounds such as AlGaN and AlInGaN. As is well understood in the art, the Group III elements can combine with nitrogen to form binary (e.g., GaN), ternary (e.g., AlGaN, AlInN) and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

In an exemplary embodiment of the invention, the device can include a diode region including a heterostructure with a p-n junction. In this embodiment of the invention, the heterostructure can include an active layer disposed between upper and lower heterostructure layers, wherein each of the active layer, the upper heterostructure layer and the lower heterostructure layer include a Group III nitride material. The active layer can include, for example, a Group III nitride epitaxial layer such as a gallium indium nitride (GaInN) layer, and each of the upper and lower heterostructure layers can include aluminum gallium nitride.

To form the p-n junction, the upper and lower heterostructure layers can have opposite conductivity types from one another, and the active layer can have the same conductivity type as one of the upper or lower heterostructure layer. As a non-limiting example, in this embodiment of the invention, the upper heterostructure layer can be a p-type, the active layer can be a n-type and the lower heterostructure layer can be a n-type. The p-n junction is thus formed between the active layer and the upper heterostructure layer. Reference is made herein to U.S. Pat. No. 5,523,589, the entire disclosure of which is hereby incorporated by reference. Additional device structures that can be useful in the present invention are described in U.S. Pat. Nos. 6,187,606; 6,664,560; and 6,791,119, and U.S. Patent Application Publication No. 2004/0149993, the contents of each of which is also incorporated herein by reference in their entirety.

The epitaxial region 24 can be formed on the substrate 22 by techniques known to those of skill in the art. The general aspects of various vapor deposition techniques for the epitaxial growth of Group III nitrides, among other materials, have been generally well established for a number of years. Furthermore, those familiar with the growth of crystals, particularly in difficult material systems, will recognize that the details of a given technique can and will vary, usually purposefully, depending upon the relevant circumstances. In addition, modifications to the present invention will be understood by those of ordinary skill in the art upon reading the description herein. Accordingly, descriptions given herein are most appropriately given in a general and schematic sense with the recognition that those persons of skill in this art will be able to carry out the invention based on the disclosures herein without undue experimentation.

As a non-limiting example, the epitaxial region 24 can be formed on the substrate 22 using metal organic vapor phase epitaxy (MOVPE). Other suitable fabrication techniques, however, can also be useful in the present invention, including without limitation molecular beam epitaxy (MBE), vapor phase epitaxy (VPE) and the like. Suitable source (or precursor) materials for the epitaxial region 24 can include Group III metal trialkyl compounds as known in the art, for example, trimethyl gallium, triethyl gallium, trimethyl aluminum, trimethyl indium, and the like, and mixtures thereof, for the Group III elements. Group V hydrides such as ammonia are suitable source materials for the nitrogen component. Exemplary techniques for epitaxial growth of Group III nitrides are described in, for example, U.S. Pat. Nos. 5,210,051; 5,393,993; 5,523,589; and 5,292,501, the contents of which are also incorporated herein by reference in their entirety.

The epitaxial region 24 can optionally include a conductive buffer region formed on surface of the substrate 22, which can be disposed between the substrate 22 and a diode region. The optional buffer layer, such as an aluminum nitride buffer layer, can provide a transition of crystal structure between the substrate 22 and the remainder of the device.

The device 20 can further optionally include a reflective layer 26 positioned below a surface of the epitaxial region 24 opposite the conductive substrate 22. The reflective layer 26 can encourage light generated in an active region of the epitaxial layer 24 to enter the substrate 22. The reflective layer can be formed of materials that can reflect light from the active region back towards the substrate 22, such as but not limited to, layers including silver and/or aluminum. FIGS. 3 and 4 also illustrate reflective layers 36 and 46, respectively.

In addition, the device 20 can optionally include a first ohmic contact 28 on a surface of the epitaxial region 24 opposite the substrate 22. In embodiments of the invention in which the substrate 22 is a conductive substrate, the device can further include a second ohmic contact 29 on the surface of the substrate 22 opposite the growth surface on which the epitaxial region 24 is grown to form a vertical LED structure. The ohmic contacts can be formed of materials as known in the art, for example but not limited to, a metal such as aluminum (Al), gold (Au), platinum (Pt), nickel (Ni), and the like.

Yet another exemplary embodiment of the invention is shown in FIG. 4, which further illustrates a device, such as a LED, mounted on a mounting support 48. The device can be bonded to the mounting support using techniques known in the art, such as but not limited to bonding regions in the form of solder preforms that are attached to the device and/or the mounting support, and that can be reflowed using conventional solder reflowing techniques. The solder performs can include, for example, a low temperature eutectic alloy, such as lead-tin, indium-gold, gold-tin and/or silver tin alloy, and the like.

LEDs according to other embodiments of the present invention such as illustrated in FIGS. 2 and 3 can further enhance light extraction from the LED by beveling or slanting at least some of the sidewall of the substrate 22 or 32, respectively. Since the incident angle of light striking the beveled sidewall 22 or 32 is generally closer to the normal than it otherwise might be, less light may be reflected back into the substrate. Accordingly, light may be extracted from the substrate, which can further improve the overall efficiency of the device.

Returning to FIG. 2, the growth surface 23, and optionally the opposing surface 25, of the substrate 22 can be treated under conditions sufficient to impart the desired degree of surface modification, for example, to roughen the growth surface to allow the epitaxial growth of a layer thereon having reduced threading dislocation density and/or enhanced light extraction when fabricated into a LED. Exemplary substrate surface treatment processes include without limitation mechanical removal of material, etching, and photonic interaction (i.e., laser ablation). Exemplary mechanical treatments include, for example, sawing, grinding, lapping, polishing, and the like. Exemplary etching processes include wet chemical and dry etching processes, such as reactive ion etching (RIE), reactive ion beam etching (RIBE), electron cyclotron resonance (ECR), inductively coupled plasma (ICP), and the like. FIGS. 5A, 5B, 6A, 6B and 7 are scanning electron microscope (SEM) images of various Si faced substrate surfaces that are roughened using RIE in accordance with various embodiments of the present invention.

Figure 8:
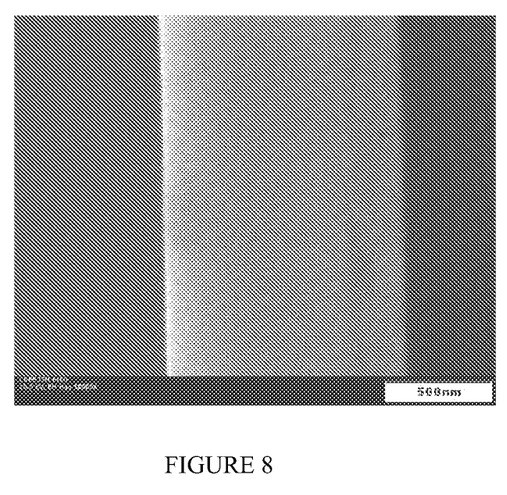
FIG. 8 is a SEM image of epitaxial growth of a Group III nitride on a SiC substrate having a substantially smooth growth surface as exemplified by the prior art.
Figure 9A:
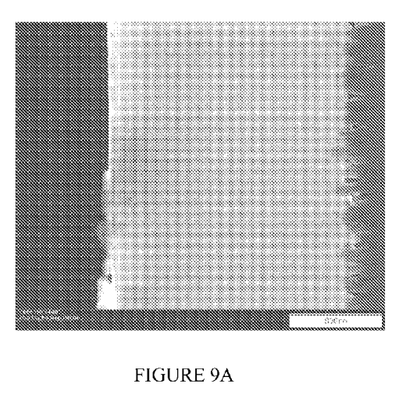
FIGS. 9A and 9B are SEM images of epitaxial growth of a Group III nitride on a SiC substrate having a roughened growth surface in accordance with various exemplary embodiments of the present invention.
Figure 9B:
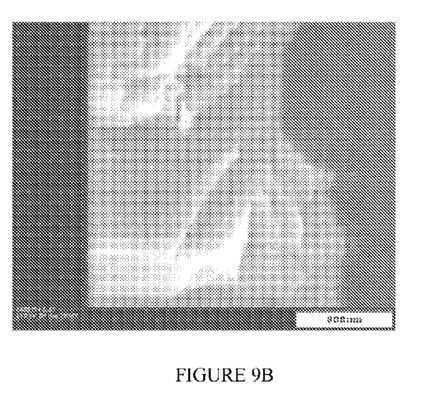

The suitability of a roughened substrate surfaces for epitaxial growth is also evaluated and the results are illustrated in FIGS. 9A and 9B, which are cross section SEM images of epitaxial growth of a Group III nitride on a Si faced substrate having a roughened growth surface (using RIE for the substrate of FIG. 9A and lapping for the substrate of FIG. 9B) in accordance with various exemplary embodiments of the present invention. FIG. 8, which is included for comparison, is a cross section SEM image of epitaxial growth of a Group III nitride on a SiC substrate having a substantially smooth growth surface as exemplified by the prior art.

Figure 10:
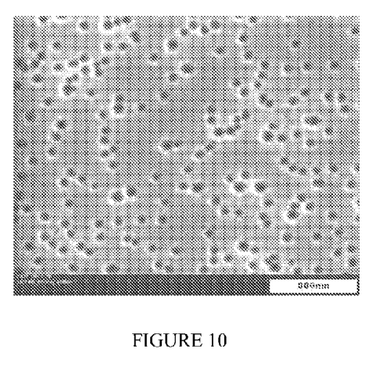
FIG. 10 is a SEM image of a Group III nitride multiple quantum well (MQW) as grown on a SiC substrate having a substantially smooth growth surface as exemplified by the prior art.
Figure 11:
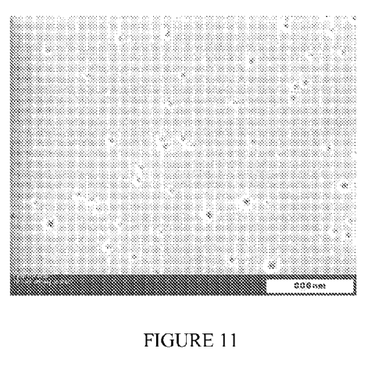
FIG. 11 is a SEM image of a Group III nitride multiple quantum well (MQW) as grown on a SiC substrate having a roughened growth surface in accordance with an exemplary embodiment of the present invention that confirms a reduction in the threading dislocations as compared to conventional planar growth.

The epitaxial growth of the device of FIGS. 9A and 9B is substantially planar and of good quality and further the roughened surface results in a 0.3 times reduction of threading dislocations, as shown in FIGS. 10 and 11. FIG. 10 is a plan view SEM image of a Group III nitride multiple quantum well (MQW) as grown on a SiC substrate having a substantially smooth growth surface as exemplified by the prior art. The resultant Group III nitride epitaxial layer exhibits a relatively high concentration of threading dislocations of about $2 \times 10^9$ cm$^{-2}$. FIG. 11 is a plan view SEM image of a Group III nitride multiple quantum well (MQW) as grown on a SiC substrate having a roughened growth surface in accordance with an exemplary embodiment of the present invention, and in particular a substrate surface roughened using RIE. The resultant Group III nitride epitaxial layer in accordance with the present invention exhibits a reduced dislocation density of about $6 \times 10^8$ cm$^{-2}$.

Figure 12:
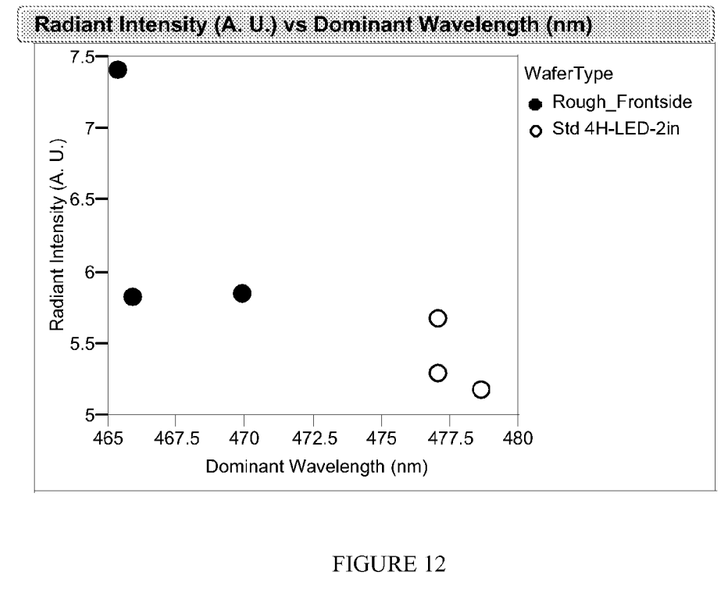
FIG. 12 is a graph illustrating electroluminescence data for Group III nitride LED grown on a SiC substrate having a substantially smooth growth surface as exemplified by the prior art and a Group III nitride LED grown on a SiC substrate having a roughened growth surface in accordance with an exemplary embodiment of the present invention.
Figure 13:
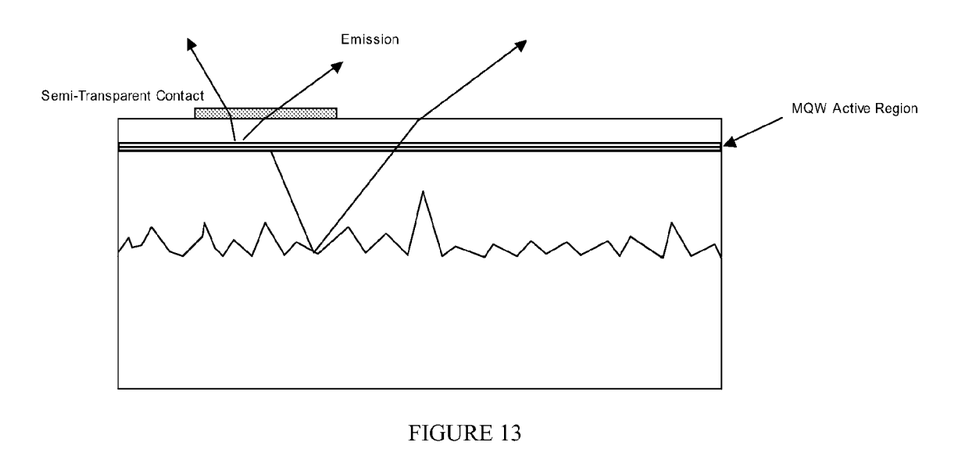
FIG. 13 is a schematic representation of a test structure useful for evaluating brightness of a device including a roughened substrate surface.

In addition to promoting the fabrication of epitaxial layers having reduced dislocation density, the present invention can also allow the production of LEDs exhibiting improved light extraction. As a non-limiting example, full LED epitaxial structures are grown on a Si-faced substrate having a surface roughened using RIE. For comparison purposes, full LED epitaxial structures are also grown on a standard substantially smooth or planar surface Si faced substrate in the same Epi run (i.e. both roughened and conventional planar substrates where grown on in the same epitaxial growth run). The planar epitaxial brightness is evaluated with an on-wafer 220×220 µm semi-transparent metal contact and the resultant electroluminescence data is illustrated in FIG. 12. A schematic of the test structure is shown in FIG. 13. The data demonstrates that LEDs prepared using a roughened substrate can exhibit a brightness that is comparable to or better than the brightness of the LEDs prepared on a substantially smooth substrate. This data is to illustrate that the Epi quality on the roughened substrate is as least as good as the quality on the conventional substrate. The test structure is not an embodiment of any of the previously indicated singulated die structures and is not to be taken as illustrative of the final enhancement, but is to demonstrate that the roughening is compatible with growth of high-quality LED epitaxial layers.

In the drawings and specification there has been set forth a preferred embodiment of the invention, and although specific terms have been employed, they are used in a generic and descriptive sense only and not for purposes of limitation, the scope of the invention being defined in the claims.

That which is claimed is:

1. A semiconductor device structure suitable for use in the fabrication of electronic devices such as light emitting diodes, comprising:
    a substrate comprising a substantially randomly or irregularly roughened growth surface suitable for supporting the growth of an epitaxial region thereon, wherein the roughened growth surface of said substrate has an average roughness $R_a$ of at least about 1 nanometer (nm);
    an epitaxial region on said substrate; and
    first and second ohmic contacts on opposite sides of said semiconductor device, such that said semiconductor device is a vertical semiconductor device.

2. The semiconductor device structure of claim 1, wherein the roughened growth surface of said substrate has an average peak to valley height $R_z$ of at least about 10 nanometers (nm).

3. The semiconductor device structure of claim 1, wherein the epitaxial region includes fewer defects as compared to the same epitaxial region on a substantially smooth growth surface of said substrate.

4. The semiconductor device structure of claim 1, wherein the epitaxial region has a threading dislocation of less than or about $6 \times 10^8$ cm$^{-2}$.

5. The semiconductor device structure of claim 4, wherein the epitaxial region has a threading dislocation of less than or about $10^8$ cm$^{-2}$.

6. The semiconductor device structure of claim 1, wherein the substrate further comprises a second roughened surface opposite the roughened growth surface.

7. The semiconductor device structure of claim 6, wherein the second roughened surface of the substrate has an average roughness $R_a$ of at least about 1 nanometer (nm).

8. The semiconductor device structure of claim 7, wherein the second roughened surface of the substrate has an average peak to valley height $R_z$ of at least about 10 nanometers (nm).

9. The semiconductor device structure of claim 1, wherein said substrate comprises a material selected from silicon carbide, aluminum nitride, gallium nitride, silicon, gallium arsenide, gallium phosphide, zinc oxide, and sapphire.

10. The semiconductor device structure of claim 1, wherein said substrate comprises a conductive substrate.

11. The semiconductor device structure of claim 1, wherein the substrate comprises silicon carbide (SiC).

12. The semiconductor device structure of claim 1, wherein the epitaxial region comprises an active region capable of emitting radiation.

13. The semiconductor device structure of claim 12, wherein the roughened growth surface of the substrate has a roughness sufficient to increase the radiation extraction efficiency of the active region as compared to the radiation extraction efficiency of the same active region on a substantially smooth growth surface.

14. The semiconductor device structure of claim 13, wherein the active region comprises a Group III nitride.

15. The semiconductor device structure of claim 14, wherein the Group III nitride is selected from the group consisting of AlN, GaN, InN, AlGaN, AlInN, InGaN, and AlInGaN.

16. The semiconductor device structure of claim 15, wherein Group III nitride comprises InGaN.

17. The semiconductor device structure of claim 12, further comprising an n-type layer along a first surface of the active region and a p-type layer on a second opposing surface of the active region to form a diode region.

18. The semiconductor device structure of claim 17, wherein each of the n-type layer and the p-type layer comprises a Group III nitride layer.

19. The semiconductor device structure of claim 1, wherein the epitaxial region includes a buffer layer.

20. A light emitting diode, comprising:
    a conductive substrate comprising a substantially randomly or irregularly roughened growth surface suitable for supporting the growth of an epitaxial region thereon, wherein the roughened growth surface of the conductive substrate has an average roughness $R_a$ of at least about 1 nanometer (nm);
    a diode region comprising an epitaxial region on the growth surface of the conductive substrate; and
    a first ohmic layer on a surface of the conductive substrate opposite the diode region and a second ohmic contact on a surface of the diode region opposite the conductive substrate.

21. The light emitting diode of claim 20, wherein the roughened growth surface of the substrate has an average peak to valley height $R_z$ of at least about 10 nanometers (nm).

22. The light emitting diode of claim 20, wherein the epitaxial region includes fewer defects as compared to the same epitaxial region on a substantially smooth growth surface of said substrate.

23. The light emitting diode of claim 20, wherein the epitaxial region has a threading dislocation of less than or about $6 \times 10^8$ cm$^{-2}$.

24. The light emitting diode of claim 23, wherein the epitaxial region has a threading dislocation of less than or about $10^8$ cm$^{-2}$.

25. The light emitting diode of claim 20, wherein the substrate further comprises a second roughened surface opposite the roughened growth surface.

26. The light emitting diode of claim 25, wherein the second roughened surface of the substrate has an average roughness $R_a$ of at least about 1 nanometer (nm).

27. The light emitting diode of claim 26, wherein the second roughened surface of the substrate has an average peak to valley height $R_z$ of at least about 10 nanometers (nm).

28. The light emitting diode of claim 20, wherein said substrate comprises a material selected from silicon carbide, aluminum nitride, gallium nitride, silicon, gallium arsenide, gallium phosphide, zinc oxide, and sapphire.

29. The light emitting diode of claim 20, wherein said substrate comprises a conductive substrate.

30. The light emitting diode of claim 20, wherein the substrate comprises silicon carbide (SiC).

31. The light emitting diode of claim 20, wherein the diode region comprises a n-type layer, an active region, and a p-type layer.

32. The light emitting diode of claim 31, wherein each of the n-type layer, the active layer and the p-type layer independently comprises a Group III nitride layer.

33. The light emitting diode of claim 20, further comprising a reflective layer on a surface of the diode region opposite the substrate.

34. The light emitting diode of claim 33, further comprising a submount on a surface of the reflective layer opposite the diode region.

35. A method of fabricating a semiconductor device structure suitable for use in the fabrication of electronic devices such as light emitting diodes, comprising:

treating a substrate growth surface suitable for supporting the growth of an epitaxial region thereon to substantially randomly or irregularly roughen the growth surface sufficient to provide a growth surface having an average roughness $R_a$ of at least about 1 nanometer (nm);

forming an epitaxial region on the roughened growth surface of the substrate; and providing first and second ohmic contacts on opposite sides of said semiconductor device, such that said semiconductor device is a vertical semiconductor device.

36. The method of claim 35, wherein the treating step comprises treating the growth surface of the substrate under conditions sufficient to provide a growth surface having an average peak to valley height $R_z$ of at least about 10 nanometers (nm).

37. The method of claim 35, wherein the forming step comprises forming an epitaxial region having fewer defects as compared to the same epitaxial region on a substantially smooth growth surface of said substrate.

38. The method of claim 35, wherein the forming step comprises forming an epitaxial region having a threading dislocation of less than or about $6 \times 10^8$ cm$^{-2}$.

39. The method of claim 38, wherein the forming step comprises forming an epitaxial region having a threading dislocation of less than or about $10^8$ cm$^2$.

40. The method of claim 35, further comprising treating a second surface of the substrate opposite the epitaxial layer under conditions sufficient to roughen the second substrate surface.

41. The method of claim 40, wherein the step of treating the second opposing surface of the substrate comprises treating the second surface of the substrate under conditions sufficient to impart thereto an average roughness $R_a$ of at least about 1 nanometer (nm).

42. The method of claim 41, wherein the step of treating the second opposing surface of the substrate comprises treating the second surface of the substrate under conditions sufficient to impart thereto an average peak to valley height $R_z$ of at least about 10 nanometers (nm).

43. The method of claim 35, wherein said substrate comprises a material selected from silicon carbide, aluminum nitride, gallium nitride, silicon, gallium arsenide, gallium phosphide, zinc oxide, and sapphire.

44. The method of claim 35, wherein said substrate comprises a conductive substrate.

45. The method of claim 35, wherein the substrate comprises silicon carbide (SiC).

46. The method of claim 35, wherein the forming step comprising forming an epitaxial region comprising an active region capable of emitting radiation.

47. The method of claim 46, wherein the treating step comprises treating the growth surface under conditions sufficient to provide a growth surface roughness sufficient to increase the radiation extraction efficiency of the active region as compared to the radiation extraction efficiency of the same active region on a substantially smooth growth surface.

48. The method of claim 47, wherein the active region comprises a Group III nitride.

49. The method of claim 48, wherein the Group III nitride is selected from the group consisting of AlN, GaN, InN, AlGaN, AlInN, InGaN, and AlInGaN.

50. The method of claim 49, wherein Group III nitride comprises InGaN.

51. The method of claim 46, further comprising forming an n-type layer along a first surface of the active region and forming a p-type layer on a second opposing surface of the active region to form a diode region.

52. The method of claim 51, wherein each of the n-type layer and the p-type layer comprises a Group III nitride layer.

53. The method of claim 35, wherein the forming step comprises forming an epitaxial buffer layer.

54. The method of claim 35, wherein the treating step comprises mechanically treating the growth surface of the substrate.

55. The method of claim 35, wherein the treating step comprises etching the growth surface of the substrate.

56. The method of claim 35, wherein the treating step comprises photonically treating the growth surface of the substrate.

57. The method of claim 51, further comprising the step of providing a reflective layer on a surface of the diode region opposite the substrate.

58. The method of claim 57, further comprising providing a submount on a surface of the reflective layer opposite the diode region.

59. The method of claim 51, further comprising providing said first ohmic contact on a surface of the substrate opposite the diode region and providing said second ohmic contact on a surface of the diode region opposite the substrate.

60. The method of claim 54, wherein the step of mechanically treating the growth surface of the substrate comprises at least one of sawing, grinding, lapping, or polishing.

61. The method of claim 55, wherein the step of etching the growth surface of the substrate comprises at least one of reactive ion etching (RIE), reactive ion beam etching (RIBE), electron cyclotron resonance (ECR) or inductively coupled plasma (ICP).

62. The method of claim 61, wherein the step of etching the growth surface of the substrate comprises reactive ion etching (RIE).

63. A semiconductor device, comprising:
a substrate comprising a substantially randomly or irregularly roughened growth surface and a substantially randomly or irregularly roughened emission surface, said growth and emission surfaces opposing each other; and
an epitaxial region on said roughened growth surface of said substrate, said epitaxial region having fewer threading dislocation defects than a substantially identical epitaxial region on a smooth growth surface.

64. The semiconductor device of claim 63, wherein first and second contacts are on opposing sides of said semiconductor device.

65. A semiconductor device structure suitable for use in the fabrication of electronic devices such as light emitting diodes, comprising:
a substrate comprising a substantially randomly or irregularly roughened growth surface suitable for supporting the growth of an epitaxial region thereon, wherein the roughened growth surface of the substrate has an average roughness $R_a$ of at least about 1 nanometer (nm);
a conductive buffer layer on said substrate; and
a diode region on said conductive region, said diode region comprising:
an active region capable of emitting radiation;
an n-type layer along a first surface of the active region; and
a p-type layer on a second, opposing surface of the active region.

* * * * *